(12) United States Patent
Lee et al.

(10) Patent No.: US 9,337,110 B2
(45) Date of Patent: May 10, 2016

(54) SEMICONDUCTOR DEVICE HAVING METAL GATE ELECTRODE AND METHOD OF FABRICATION THEREOF

(75) Inventors: Da-Yuan Lee, Jhubei (TW); Kuang-Yuan Hsu, Fongyuan (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 779 days.

(21) Appl. No.: 13/276,859

(22) Filed: Oct. 19, 2011

(65) Prior Publication Data

US 2013/0099320 A1 Apr. 25, 2013

(51) Int. Cl.
*H01L 21/8238* (2006.01)
*H01L 29/49* (2006.01)
*H01L 29/66* (2006.01)
*H01L 29/51* (2006.01)

(52) U.S. Cl.
CPC .... *H01L 21/823842* (2013.01); *H01L 29/4966* (2013.01); *H01L 29/4975* (2013.01); *H01L 29/517* (2013.01); *H01L 29/66545* (2013.01); *H01L 29/513* (2013.01)

(58) Field of Classification Search
CPC . H01L 29/772; H01L 29/3205; H01L 29/513; H01L 21/823842; H01L 29/66545; H01L 29/517; H01L 29/4975
USPC ....................................................... 257/368
See application file for complete search history.

(56) References Cited

U.S. PATENT DOCUMENTS

| | | | | |
|---|---|---|---|---|
| 7,338,865 | B2* | 3/2008 | Murto et al. | 438/275 |
| 7,973,413 | B2 | 7/2011 | Kuo et al. | |
| 8,048,810 | B2* | 11/2011 | Tsai et al. | 438/703 |
| 8,193,582 | B2* | 6/2012 | Matsubara | 257/334 |
| 8,283,222 | B2* | 10/2012 | Hsu et al. | 438/183 |
| 2008/0265420 | A1* | 10/2008 | Yu | H01L 21/28097 257/754 |
| 2011/0081774 | A1* | 4/2011 | Yeh et al. | 438/591 |
| 2011/0143529 | A1* | 6/2011 | Lee et al. | 438/591 |
| 2011/0266637 | A1* | 11/2011 | Lee et al. | 257/410 |
| 2012/0129331 | A1* | 5/2012 | Choi et al. | 438/592 |
| 2012/0211759 | A1* | 8/2012 | Liu | H01L 21/02381 257/76 |
| 2013/0082332 | A1* | 4/2013 | Liu et al. | 257/369 |

OTHER PUBLICATIONS

Da-Yuan Lee, Jian-Hao Chen, Chi-Chun Chen, Matt Yeh and Hsing-Jui Lee; "Fabricating High-K/Metal Gate Devices in a Gate Last Process;" U.S. Appl. No. 12/567,227, filed Sep. 25, 2009; 64 pages.

(Continued)

*Primary Examiner* — Evan Pert
*Assistant Examiner* — Damon Hillman
(74) *Attorney, Agent, or Firm* — Haynes and Boone, LLP

(57) ABSTRACT

The present disclosure provides a method including providing a substrate having a first opening and a second opening on the substrate. A blocking layer is formed in the first opening. A second metal gate electrode is formed the second opening while the blocking layer is in the first opening. The blocking layer is then removed from the first opening, and a first metal gate electrode formed. In embodiments, this provides for a device having a second gate electrode that includes a second work function layer and not a first work function layer, and the first gate electrode includes the first work function layer and not the second work function layer.

17 Claims, 17 Drawing Sheets

(56) References Cited

OTHER PUBLICATIONS

Xiong-Fei Yu, Wei-Yung Lee, Da-Yuan Lee, Kuang-Yuan Hsu, Yuan-Hung Chiu, Hun-Jan Tao, Hongyu Yu and Wu Ling; "Multiple Deposition, Multiple Treatment Dielectric Layer for a Semiconductor Device;" U.S. Appl. No. 12/761,159. filed Apr. 15, 2010; 36 pages.

Da-Yuan Lee and Matt Yeh; "Precise Resistor on a Semiconductor Device;" U.S. Appl. No. 12/770,166, filed Apr. 29, 2010; 34 pages.

Da-Yuan Lee; Kuang-Yuan Hsu; Matt Yeh; Yi-Chen Huang; Fan-Yi Hsu; Hui Ouyang; Ming-Jie Huang and Shin Hsien Liao; "Modified Profile Gate Structure for Semiconductor Device and Methods of Forming Thereof;" U.S. Appl. No. 12/872,642, filed Aug. 31, 2010; 47 pages.

Da-Yuan Lee and Kuang-Yuan Hsu; "Gate Dielectric of Semiconductor Device;" U.S. Appl. No. 13/188,091, filed Jul. 21, 2011; 30 pages.

\* cited by examiner

SEMICONDUCTOR DEVICE HAVING METAL GATE ELECTRODE AND METHOD OF FABRICATION THEREOF

BACKGROUND

The present disclosure relates generally to forming a semiconductor device on a substrate and, more particularly, to forming a gate structure of a semiconductor device.

Semiconductor device geometries continue to dramatically decrease in size. Today's fabrication processes are routinely producing devices having feature dimensions less than 65 nm. However, solving the problems associated with implementing new process and equipment technology while continuing to satisfy device requirements has become more challenging. For example, metal-oxide-semiconductor (MOS) transistors have typically been formed with polysilicon gate electrodes. Polysilicon has advantageous thermal resistive properties and can allow for formation of self aligned source/drain structures.

However, in order to continually meet performance requirements, there has been a desire to replace the polysilicon gate electrode with a metal gate electrode. One process of implementing metal gates is termed a "gate last" or "replacement gate" methodology. In such a process, a dummy (e.g., sacrificial) polysilicon gate is initially formed, various processes associated with the semiconductor device are performed, and the dummy gate is subsequently removed and replaced with a metal gate. However, care must be taken during the process to provide the adequate work function of the resulting metal gate. Typically however due to processing constraints, one or more of the resultant devices includes both p-type work function metal and n-type work function metal. For example, an NMOSFET will contain both p-type work function metal as well as the n-type work function metal. This may be disadvantageous as the flat band voltage of the work function metal is impacted by the metal having the opposite work function. Thus, what is desired is a semiconductor device and/or method of fabricating thereof that provides for threshold voltage controllability through selection of work function metals.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

It is to be understood that the following disclosure provides many different embodiments, or examples, for implementing different features of the invention. Specific examples of components and arrangements are described below to simplify the present disclosure. These are, of course, merely examples and are not intended to be limiting. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Similarly, relative terms such as "above" or "below" and the like are provided for ease of description only and not intended to provide an absolute orientation (e.g., the device may be flipped such that the "top" becomes the "bottom"). Various features may be arbitrarily drawn in different scales for simplicity and clarity.

Figure 1A:
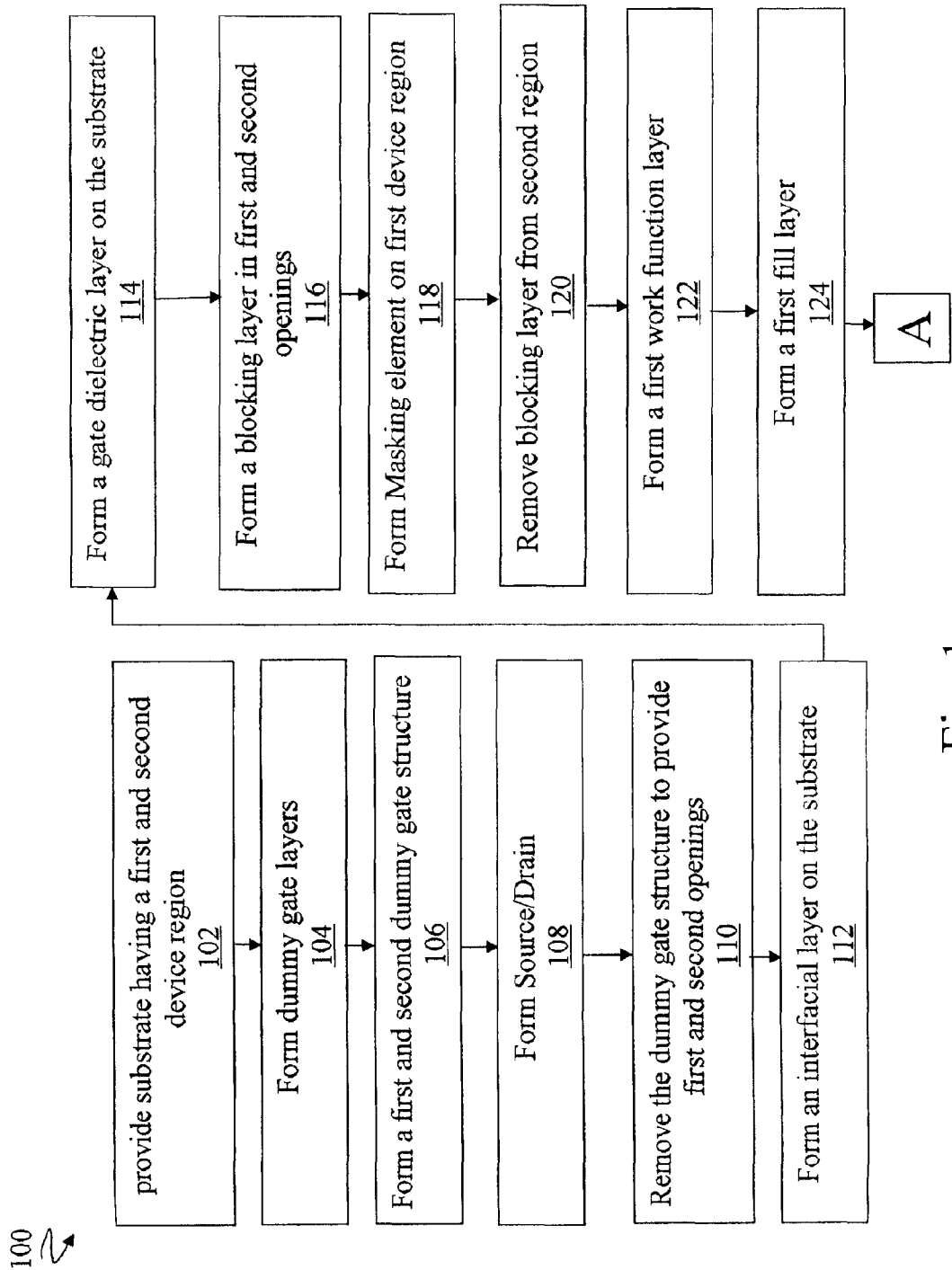
FIGS. 1a and 1b provide a flow chart illustrating an embodiment of a method of fabricating a semiconductor device according to one or more aspects of the present disclosure.
Figure 1B:
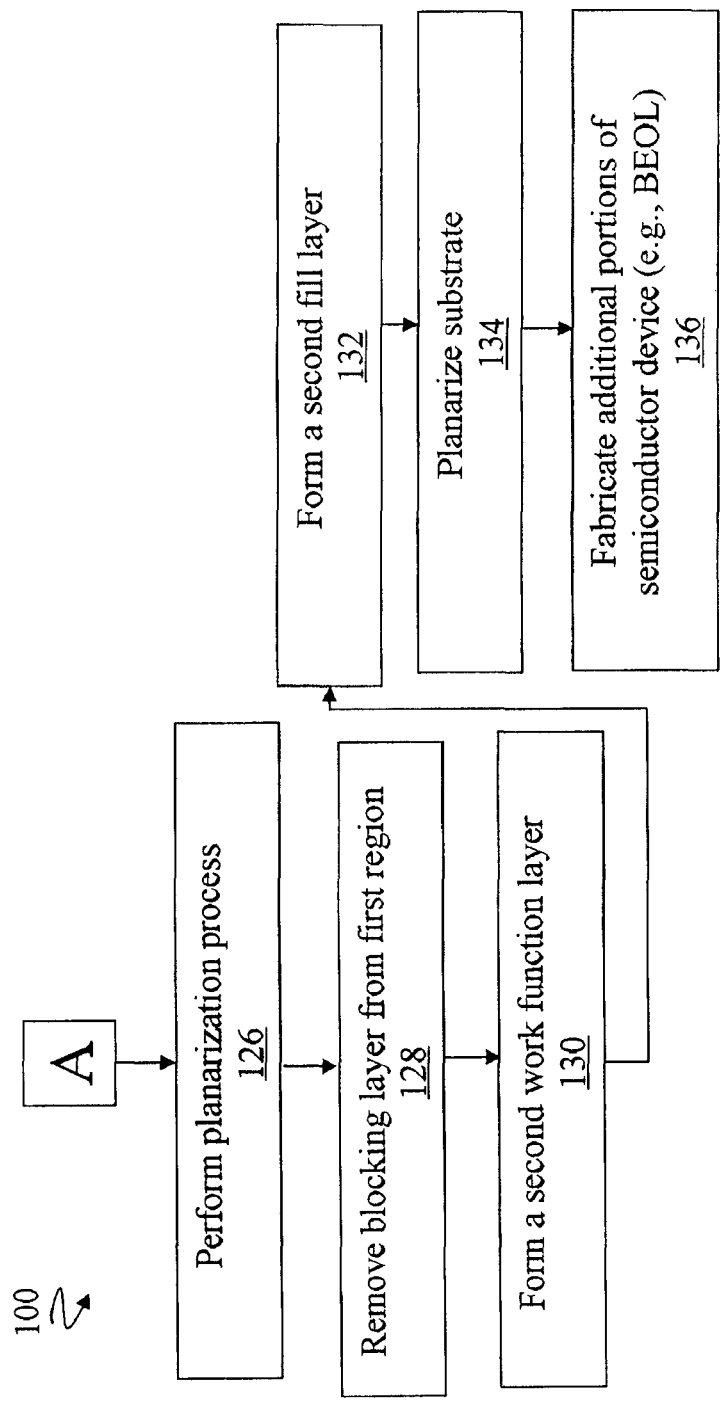
Figure 2:
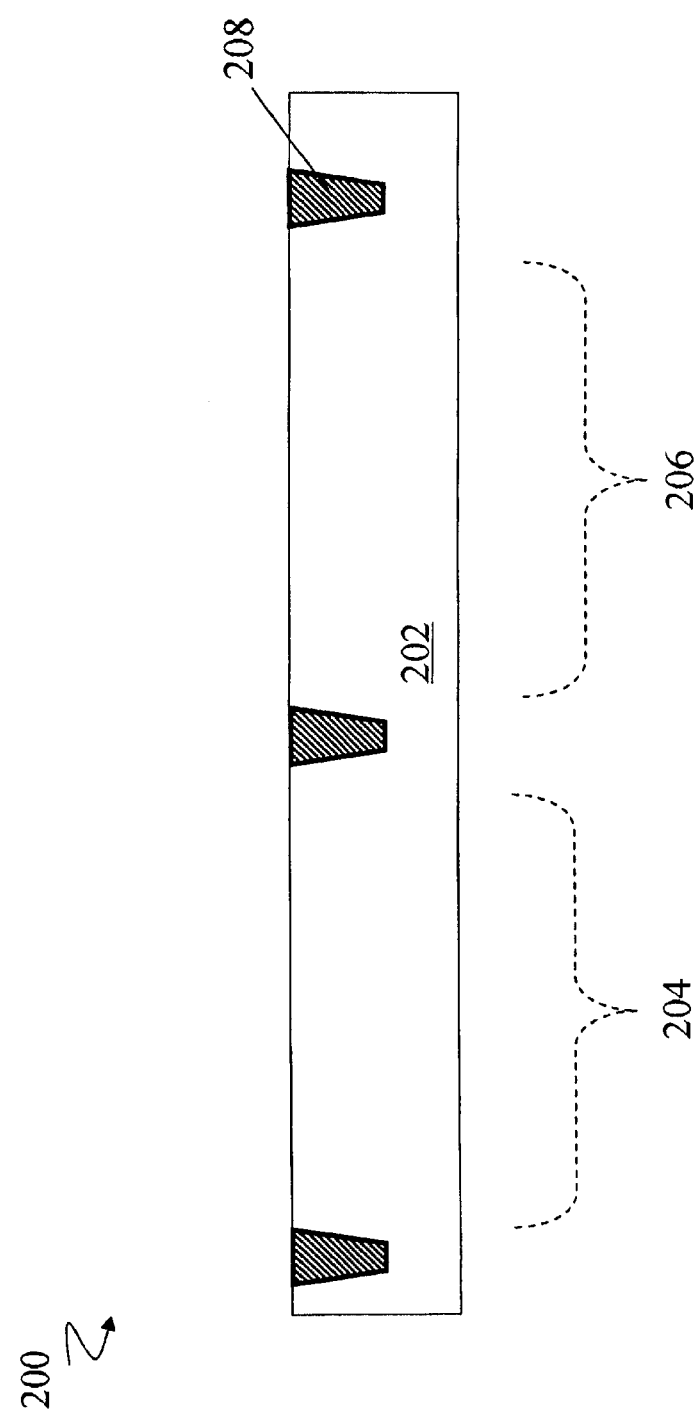
FIGS. 2-16 illustrate cross-sectional views of an embodiment of a semiconductor device corresponding to one or more of the steps of the method of FIG. 1.

Referring to FIG. 1, illustrated is a method 100 for fabricating a semiconductor device using a gate last methodology according to one or more aspects of the present disclosure. FIGS. 2-16 are cross-sectional views of a semiconductor device 200 at various stages of fabrication according to an embodiment of the method of FIG. 1. The method 100 may provide a device including a semiconductor device having a single type of work function metal for one or more gate structures. For example, the method 100 may be used to fabricate a device including an n-type metal-oxide-semiconductor field effect transistor (NMOSFET) having n-type work function metal in its gate structure (and not p-type work function metal) and a p-type metal-oxide-semiconductor field effect transistor (PMOSFET) having p-type work function metal in its gate structure (and not n-type work function metal). In embodiments, the respective FET does not include a work function layer of the opposite type.

It is understood that parts of the semiconductor device 200 may be fabricated by complementary metal-oxide-semiconductor (CMOS) technology process flow, and thus some processes are only briefly described herein. Further, the semiconductor device 200 may include various other devices and features, such as other types of transistors such as additional transistors, bipolar junction transistors, resistors, capacitors, diodes, fuses, etc., but is simplified for a better understanding of the inventive concepts of the present disclosure. The semiconductor device 200 includes a plurality of semiconductor devices (e.g., transistors), which may be interconnected to form an integrated circuit device.

The method 100 begins at block 102 where a semiconductor substrate is provided. The semiconductor substrate includes a plurality of device regions. In an embodiment, the plurality of device regions may be associated with different types of semiconductor devices. For example, a first region may be defined to include one of n-type or p-type field effect transistors. The second region may be defined to include the other one of n-type or p-type field effect transistors. In an embodiment, the devices of at least two of the regions of the plurality of regions are designed to have different gate stacks. For example, the devices of two different regions may be designed to have a different composition of layers including different work function, different thicknesses, etc. In an embodiment, the first region is defined as including n-type MOSFETs (NMOSFETS). In an embodiment, the second region is defined as including p-type MOSFETs (PMOSFETS). Thus, the semiconductor substrate may be appropriately doped in the first and/or second region. One or more isolation features may interpose the regions.

The semiconductor substrate may be silicon substrate. Alternatively, the substrate comprises another elementary semiconductor, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof In yet another alternative, the substrate is a semiconductor on insulator (SOI). In other alternatives, semiconductor substrate may include a doped epi layer, a gradient semiconductor layer, and/or a semiconductor layer overlying another semiconductor layer of a different type, such as a silicon layer on a silicon germanium layer. The substrate may include doped regions, such as a p-well, an n-well, or combination thereof Referring to the example of FIG. 2, a semiconductor substrate 202 is provided. The substrate 202 includes silicon. The substrate 202 includes a first region 204 and a second region 206. In an embodiment, the first region 204 includes a region where an n-type metal oxide semiconductor field effect transistor (NMOSFET) is formed. In an embodiment, the second region 206 includes a region where a p-type metal oxide semiconductor field effect transistor (PMOSFET) is formed.

The semiconductor substrate 202 includes isolation structures 208 formed on the substrate 202 for isolating the regions of the substrate. The isolation structures 208 may be formed of silicon oxide, silicon nitride, silicon oxynitride, fluoride-doped silicate glass (FSG), a low-k dielectric material, and/or other suitable insulating material. The isolation structures 208 may be shallow trench isolation (STI) features, local oxidation (e.g., LOCOS), and/or other suitable isolation structures. In an embodiment, the isolation structures 208 are STI features and are formed by etching trenches in the substrate 202. The trenches may then be filled with isolating material, followed by a chemical mechanical polish (CMP).

The method 100 then proceeds to block 104 where dummy (or sacrificial) layers are formed. The layers may be used to form a dummy gate structure. A dummy gate structure is a sacrificial structure provided in the place where metal gate will be subsequently formed. This process is typically known as a gate-last or replacement gate methodology.

In an embodiment, in block 104, a dummy gate dielectric layer is formed. The dummy gate dielectric may be a thermally grown oxide such as silicon dioxide (also referred to as silicon oxide). Alternatively, the dummy gate dielectric may be formed by chemical vapor deposition (CVD), atomic layer deposition (ALD), and/or other suitable process. The thickness of the dummy gate dielectric layer may be between approximately 10 Angstroms and approximately 100 Angstroms.

In an alternative embodiment of the method 100, the gate dielectric formed in block 104 may not be sacrificial but remain on the substrate. In an embodiment, the gate dielectric may be a high-k dielectric material. The high-k dielectric layer may include hafnium oxide ($HfO_2$). Alternatively, the high-k dielectric layer may optionally include other high-k dielectrics, such as $TiO_2$, HfZrO, $Ta_2O_3$, $HfSiO_4$, $ZrO_2$, $ZrSiO_2$, combinations thereof, or other suitable material. The high-k dielectric layer may be formed by atomic layer deposition (ALD) and/or other suitable methods.

Figure 3:
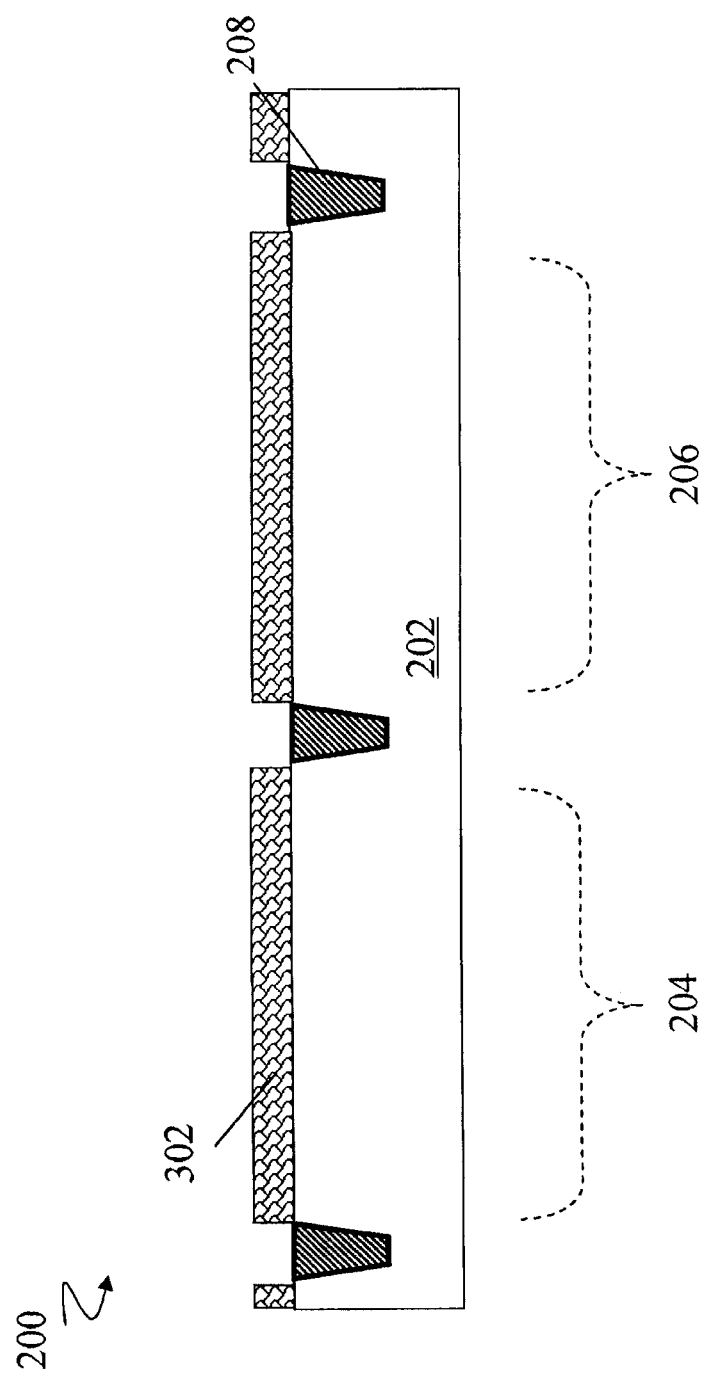

Referring to the example of FIG. 3, a dummy gate dielectric layer 302 is formed on the substrate 202. In an embodiment, the dummy gate dielectric layer 302 is thermally grown silicon dioxide.

Figure 4:
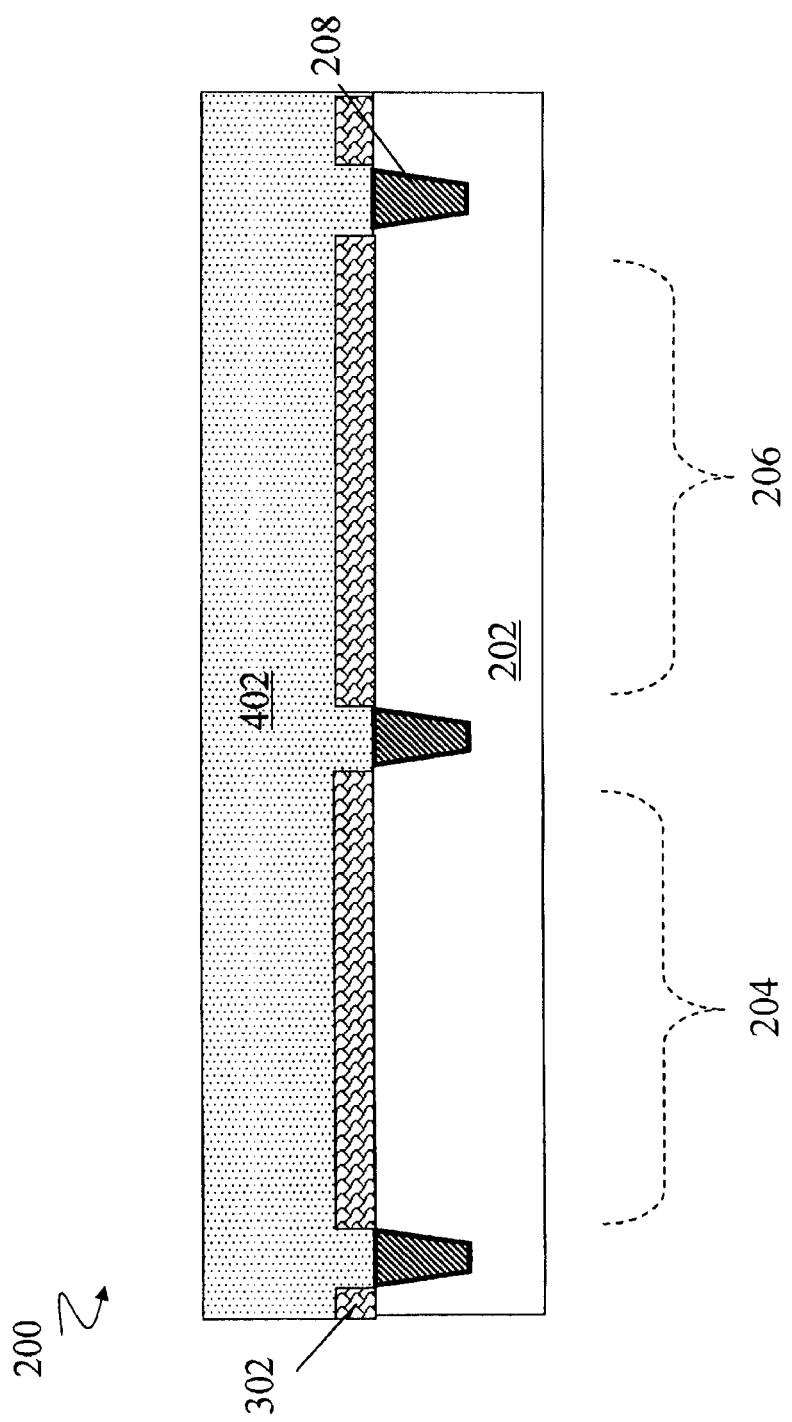

Block 104 further includes forming a dummy gate electrode material to be used in the dummy gate structure. The dummy gate electrode material is deposited, for example, by physical vapor deposition (PVD) or chemical vapor deposition (CVD). Exemplary materials for the dummy gate electrode include polysilicon, silicon, and/or other suitable materials. Referring to the example of FIG. 4, illustrated is the semiconductor device 200 including a dummy gate material 402 formed on the substrate 202 and overlying the dummy gate dielectric 302. The dummy gate material 402 may be formed by PVD and CVD and disposed across the substrate 202. In an embodiment, the dummy gate material 402 is polysilicon.

The method 100 then proceeds to block 106 where dummy gate structure(s) are formed. The dummy gate structure may include the dummy gate dielectric and dummy gate electrode materials. For instance, the dummy gate material (e.g., dielectric and electrode) may be patterned and etched into one or more dummy gate structures.

Figure 5:
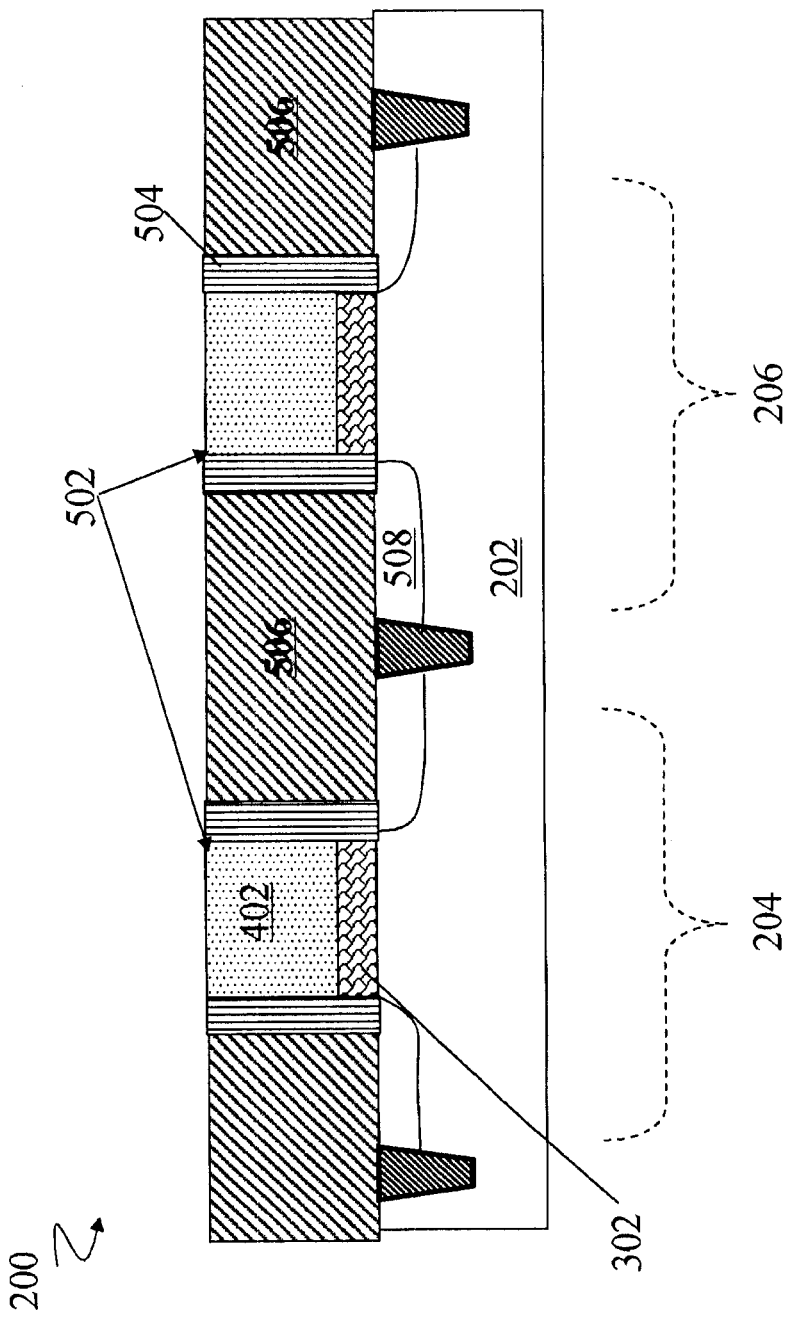
Figure 6:
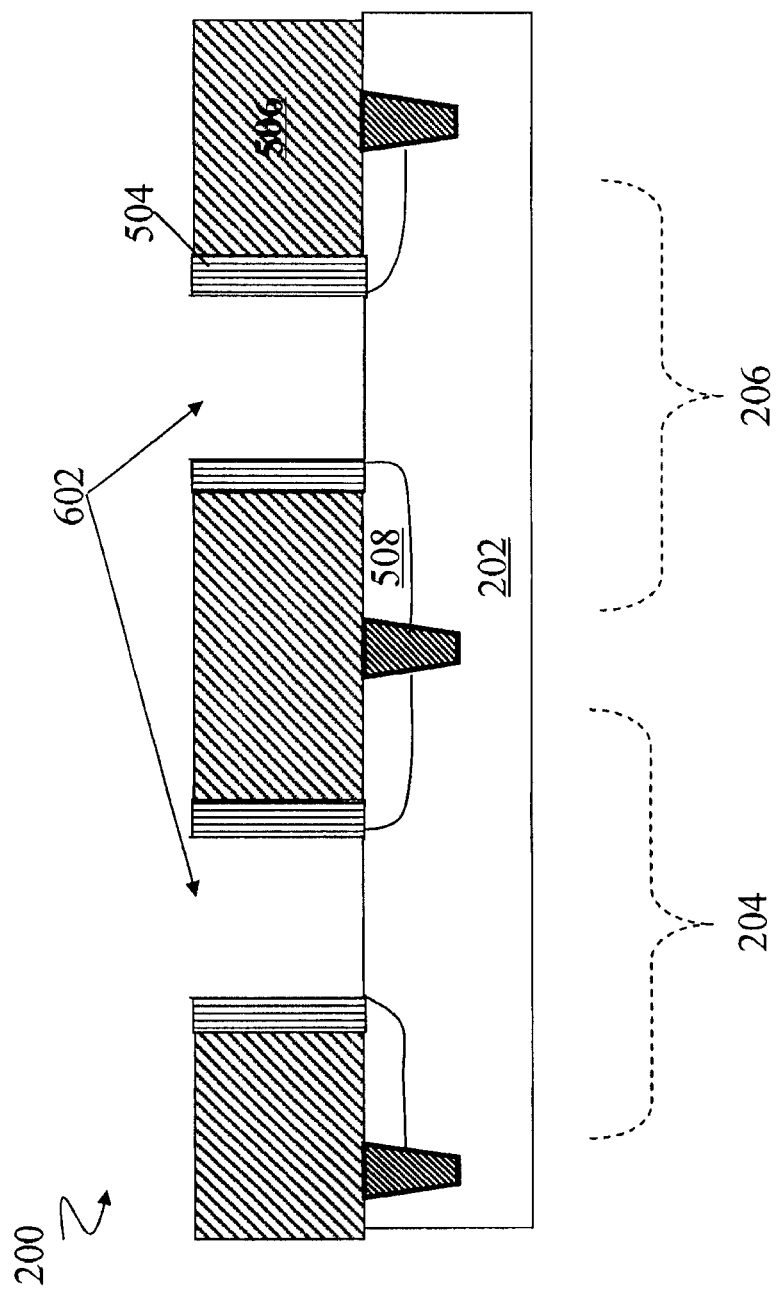
Figure 7:
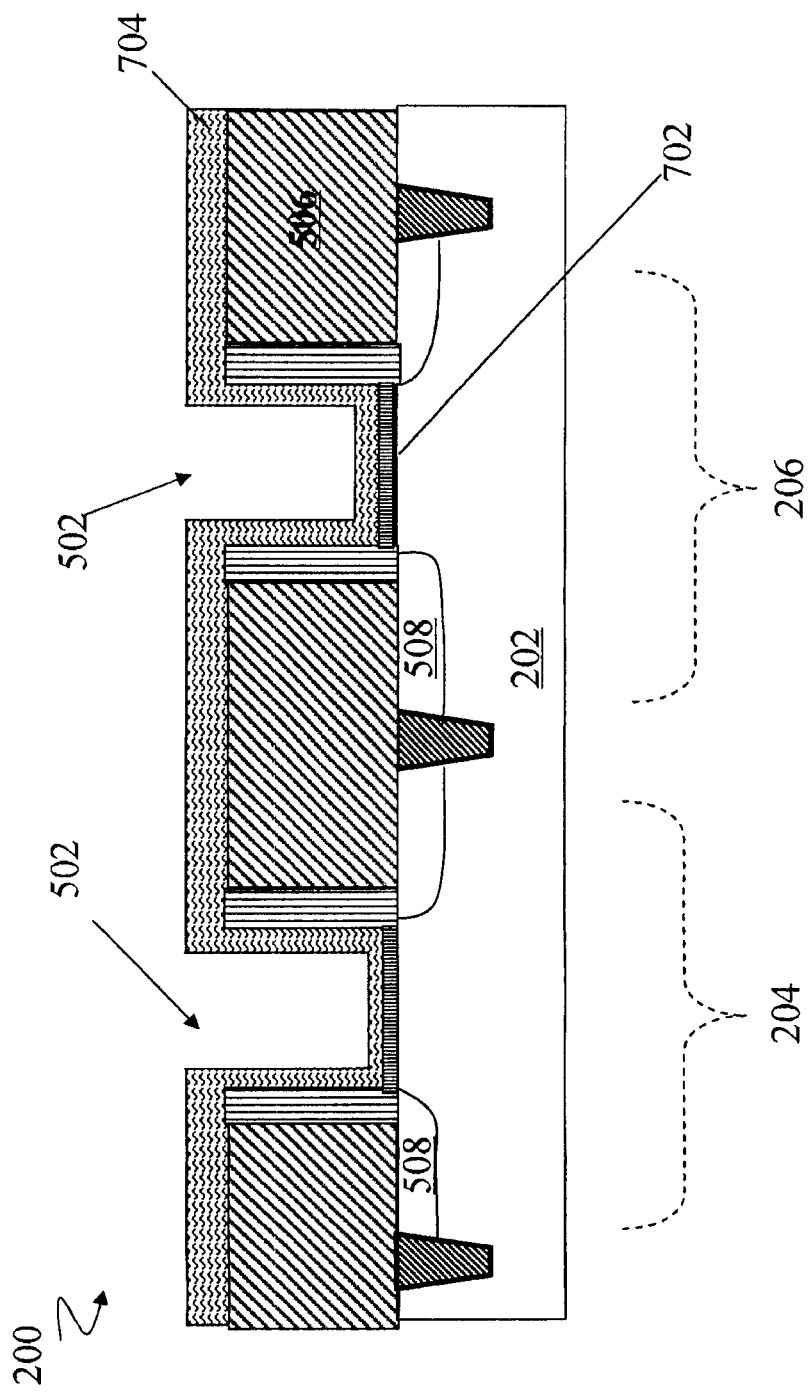

Referring to the example of FIG. 5, a plurality of dummy gate structures 502 is formed. The dummy gate structures 502 include the patterned dummy gate electrode material 402, described above with reference to FIG. 4 and the dummy gate dielectric material 302, described above with reference to FIG. 3, and is disposed on the substrate 202. The dummy gate structures 502 may be formed using suitable processes such as photolithography and etching processes (e.g., wet etch and/or dry etch).

In further processing in block 106, in an embodiment, spacer elements are formed on either side of the dummy gate structure (or gate stack) as is known in the art. The spacer elements may be formed by depositing insulating material, followed by an anisotropic etching to shape the spacer elements. Referring to the example of FIG. 5, sidewall spacers 504 are formed adjacent the dummy gate structures 502. The sidewall spacers 504 may include silicon nitride, silicon oxide, silicon oxynitride, and/or other suitable dielectric materials. In embodiments, the sidewall spacers 504 include a plurality of layers, for example, liner layers.

After forming the dummy gate structures, the method 100 then proceeds to block 108 where a source/drain region is formed. As in typical gate-last processes, source/drain regions or portions thereof may be formed adjacent the dummy gate structures prior to the sidewall spacers (e.g., low-dose drain (LDD)) and/or after the sidewall spacers are formed. The source/drain regions may be formed processes such as ion implantation, thermal diffusion, and/or other suitable processes. Referring to the example of FIG. 5, source/drain regions 508 are formed in the substrate 202. The source/drain regions 508 may be suitably doped to provide the relevant conductivity. In an embodiment, the source/drain regions 508 in the first region 204 may provide the source/drain for an NMOSFET and be regions having an n-type dopant (e.g., n+ region). In an embodiment, the source/drain regions 508 in the second region 206 may provide the source/drain for a PMOSFET and be regions having a p-type dopant (e.g., p+ region).

In still further processing, in an embodiment of the method 100, an inter-layer dielectric (ILD) layer is formed on semiconductor substrate interposing the dummy gate structures. Referring to the example of FIG. 5, an ILD layer 506 is formed on the substrate 202. The ILD layer 506 may be formed by chemical vapor deposition (CVD), high density plasma CVD (HDP-CVD), spin-on deposition, physical vapor deposition (PVD or sputtering), or other suitable methods. The ILD layer 506 may include silicon oxide, silicon oxynitride, a low-k material, and/or other suitable dielectric. The ILD layer 506 may be conformably deposited on the substrate 202 and a CMP process performed. The dummy gate structure 502 may serve as a planarization stop for the CMP process. In other words, the CMP process may be stopped at the exposure of the top surface of the dummy gate structure(s). FIG. 5 illustrates a substantially planar surface.

The method 100 then proceeds to block 110 where the dummy gate structures are removed from the substrate. A dummy gate structure may be removed by an etching solution such as, for example, $NH_4OH$, dilute-HF, and/or other suitable etchant. In an alternative embodiment, the dummy gate structure may be removed by a suitable dry etching process. Example etchants include fluorine and/or chlorine based etchants. The removal of the dummy gate structure provides for openings within which a metal gate will be formed, as is typically performed in a replacement gate process. The dummy gate structure removal may include removing a dummy gate electrode and/or a dummy gate dielectric layer. Exemplary processes to remove the dummy gate dielectric layer include liquid or gas phase diluted HF. Referring to the example of FIG. 6, the dummy gate electrodes 502 (described above and illustrated in FIG. 5) have been removed from the substrate leaving openings (or trenches) 602.

The method 100 then proceeds to block 112 where an interfacial layer is formed on the substrate. The interfacial layer may include silicon oxide layer ($SiO_2$), silicon oxynitride (SiON), and/or other suitable dielectric material including native oxide, chemical oxide, thermal oxide, ALD/CVD oxide. In an embodiment, the interfacial layer has a thickness ranging from about 5 to about 15 angstroms. The interfacial layer may be formed by chemical oxidation, thermal oxidation, atomic layer deposition (ALD), CVD, and/or other suitable dielectric. In other embodiments, block 112 is omitted from the method 100. Referring to the example of FIG. 7, an interfacial layer 702 is formed on the substrate 202 in the openings 602.

The method 100 then proceeds to block 114 where a gate dielectric layer is formed on the substrate. The gate dielectric layer may include silicon dioxide or other suitable dielectric. In an embodiment, the gate dielectric is a high-k dielectric layer. (As noted above, in alternative embodiments, the method 100 may include a process where a gate dielectric formed underlying the dummy gate electrode is not removed.) The high-k gate dielectric layer may be formed on each of the first and second regions of the substrate concurrently. In alternative embodiments, different dielectric materials may be used on the first and second regions. The high-k dielectric layer may include hafnium oxide ($HfO_2$). Alternatively, the high-k dielectric layer may optionally include other high-k dielectrics, such as $TiO_2$, HfZrO, $Ta_2O_3$, $HfSiO_4$, $ZrO_2$, $ZrSiO_2$, combinations thereof, and/or other suitable material.

The gate dielectric layer may be formed by atomic layer deposition (ALD), chemical vapor deposition (CVD), physical vapor deposition (PVD), and/or other suitable methods. The gate dielectric layer may be between approximately 10 Angstroms and approximately 100 Angstroms in thickness. Referring to the example of FIG. 7, a high-k gate dielectric layer 704 is formed on the substrate 202.

The method 100 then proceeds to block 116 where a blocking layer is formed on the substrate. The blocking layer may also be referred to as a hard mask layer. The blocking layer may be formed on the gate dielectric layer and in the openings provided by the removal of the dummy gate structure. In an embodiment, to form the blocking layer a conformal layer of hard mask material is provided on the substrate. Subsequently, the hard mask material may be planarized, for example, using a chemical mechanical polish (CMP) process. The planarization may remove the hard mask material overlying the ILD layer. The gate dielectric layer may act as an etch stop for the planarization process. The resultant layer, the blocking layer, includes hard mask material formed in the openings provided by the removal of the dummy gate structure.

The hard mask material for the blocking layer may be formed by CVD, ALD, physical vapor deposition (PVD), spin-on deposition processes, and/or other suitable deposition methods. Exemplary materials include polysilicon, amorphous silicon, $Si_3N_4$, $SiO_2$, spin-on glass (SOG), and combinations thereof.

Figure 8:
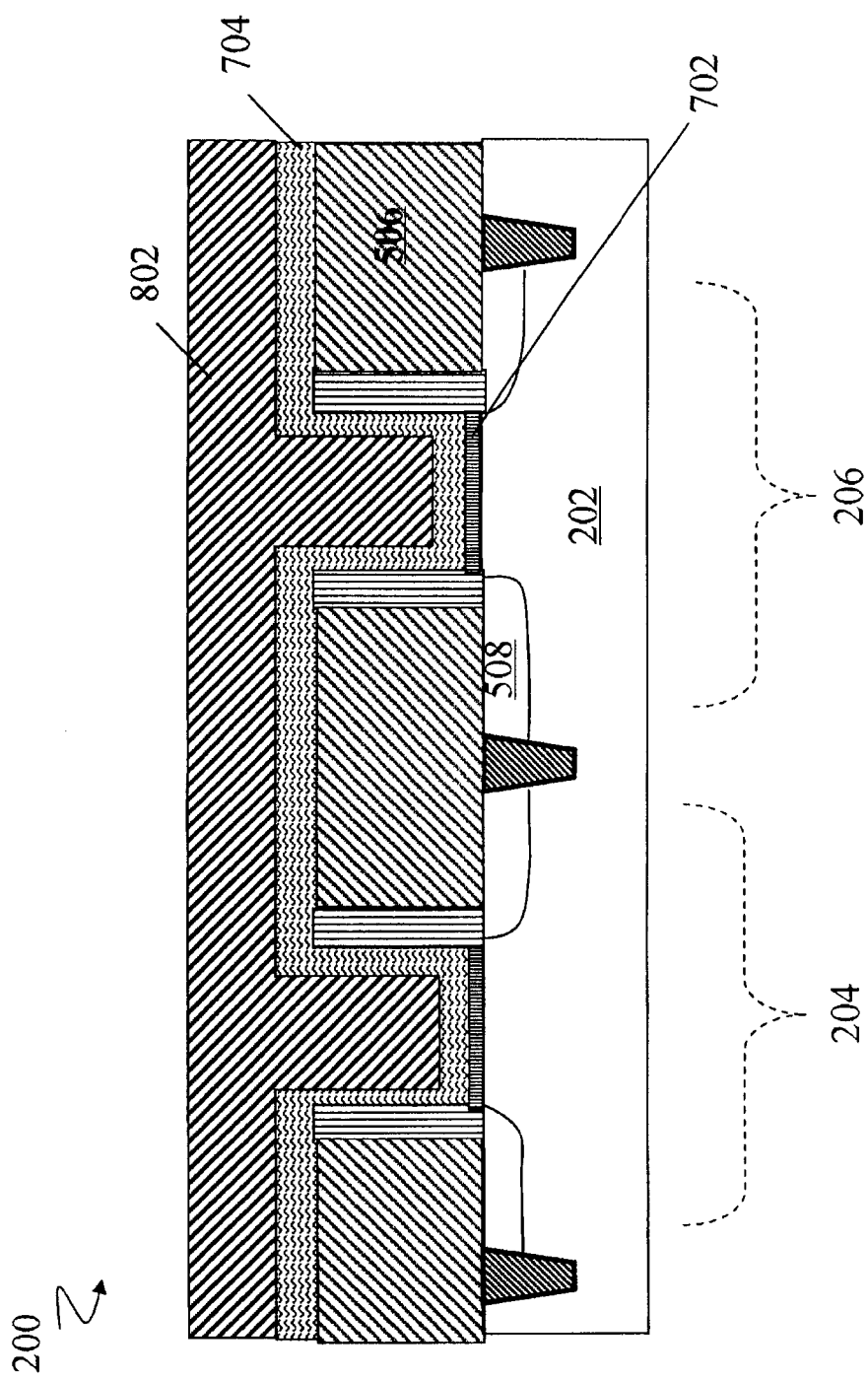
Figure 9:
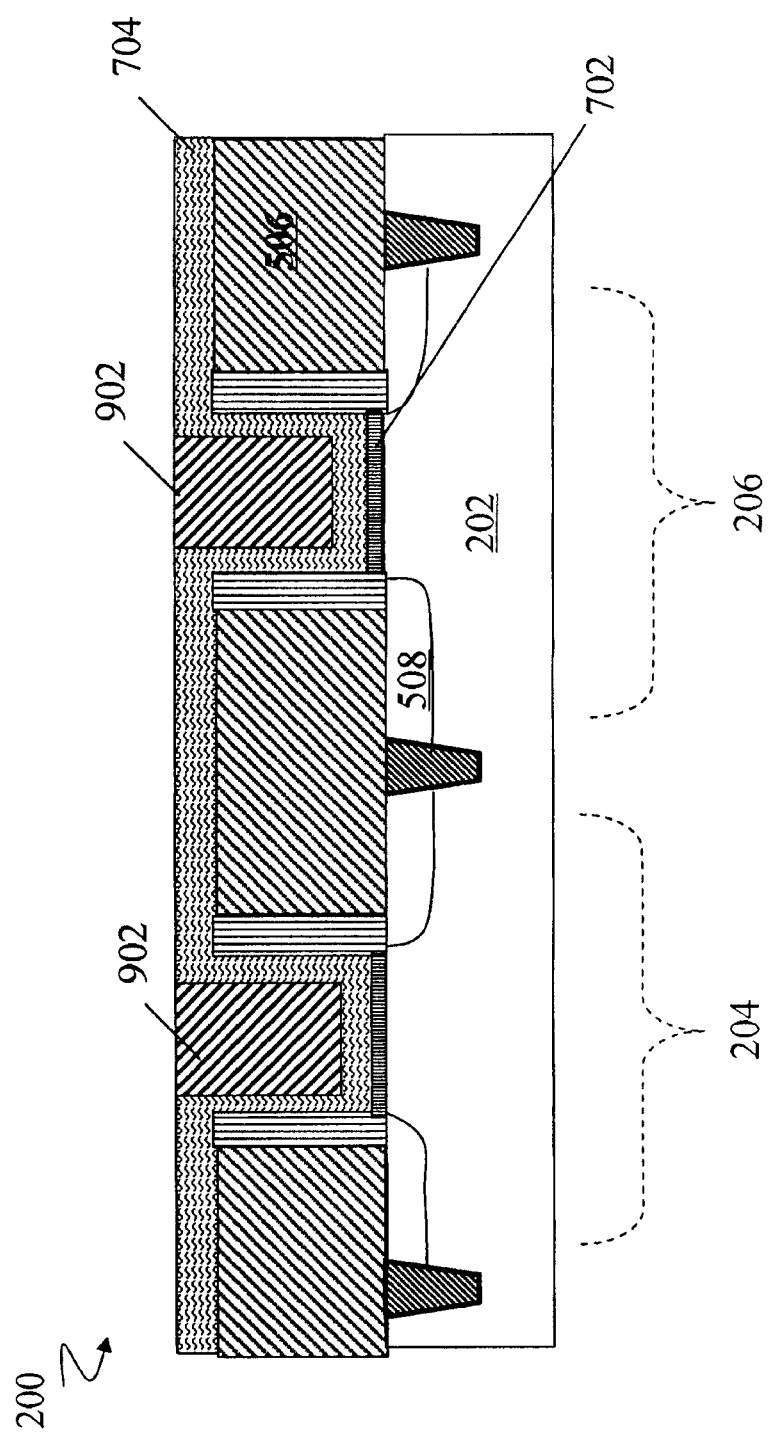
Figure 10:
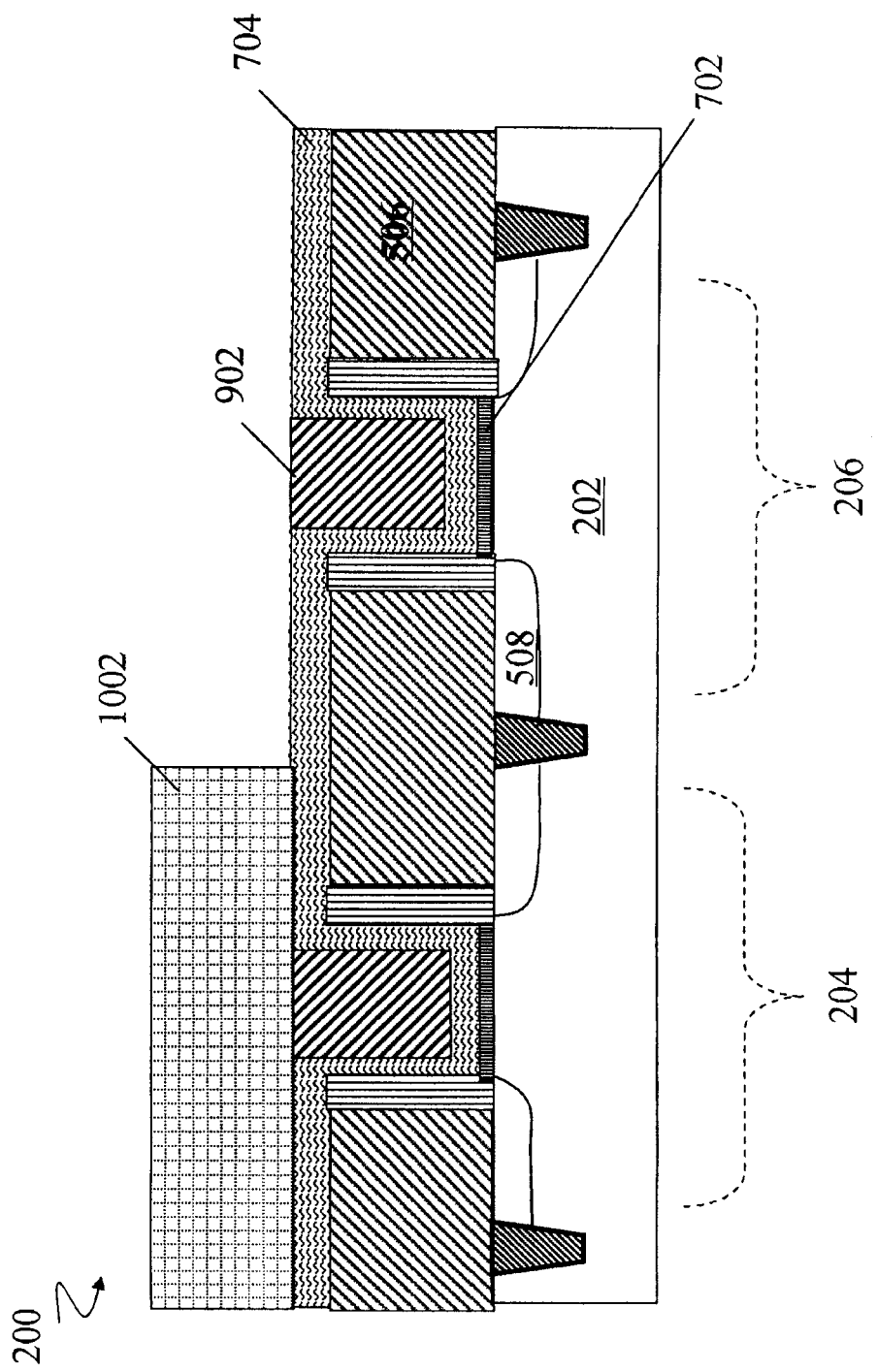

Referring to the example of FIG. 8, a hard mask material 802 is formed on the substrate 202. The hard mask material 802 is then planarized, as described above. FIG. 9 illustrates the resultant blocking layer 902. The blocking layer 902 may include polysilicon, amorphous silicon, $Si_3N_4$, $SiO_2$, spin-on glass (SOG), and combinations thereof As illustrated in FIG. 9, the top surface of the blocking layer 902 is substantially co-planar with the gate dielectric 704 formed on the surface of the ILD layer 506.

The method 100 then proceeds to block 118 where a masking element is formed on the first device region. The masking element is suitable for protecting a portion of a substrate, while processing an exposed region of the substrate. In an embodiment, the masking element includes photoresist. In an embodiment, the masking element is formed over the NMOS-FET region. In some embodiments, the masking element may include an additional hard mask layer. The masking element may be formed by typical deposition (e.g., spin-on) and photolithography processes. Referring to the example of FIG. 10, a masking element 1002 is disposed on the first device region 204 of the substrate 202. The masking element 1002 may be a photoresist feature. The masking element 1002 may be formed by deposition of photoresist (e.g., spin-on) and photolithography processes to pattern the deposited photoresist including exposure, bake, development, and further bake and cleaning processes.

The method 100 then proceeds to block 120 where the blocking layer is removed from the second region of the substrate. The blocking layer in the second region is removed while the masking element protects the blocking layer in the first region from removal. The blocking layer may be removed by suitable methods. These methods include $NH_4OH$ and dilute-HF (DHF) solutions, solvents, phosphoric acid, and dry etch. In an embodiment, the blocking layer includes polysilicon and/or amorphous silicon and is removed by $NH_4OH$ and/or DHF solutions. In another embodiment, the blocking layer includes $SiO_2$ or SOG and is removed by DHF. In yet another embodiment, the blocking layer includes SOG and is removed by a suitable solvent. In an embodiment, the hard mask includes $Si_3N_4$ and is removed by phosphoric acid.

Figure 11:
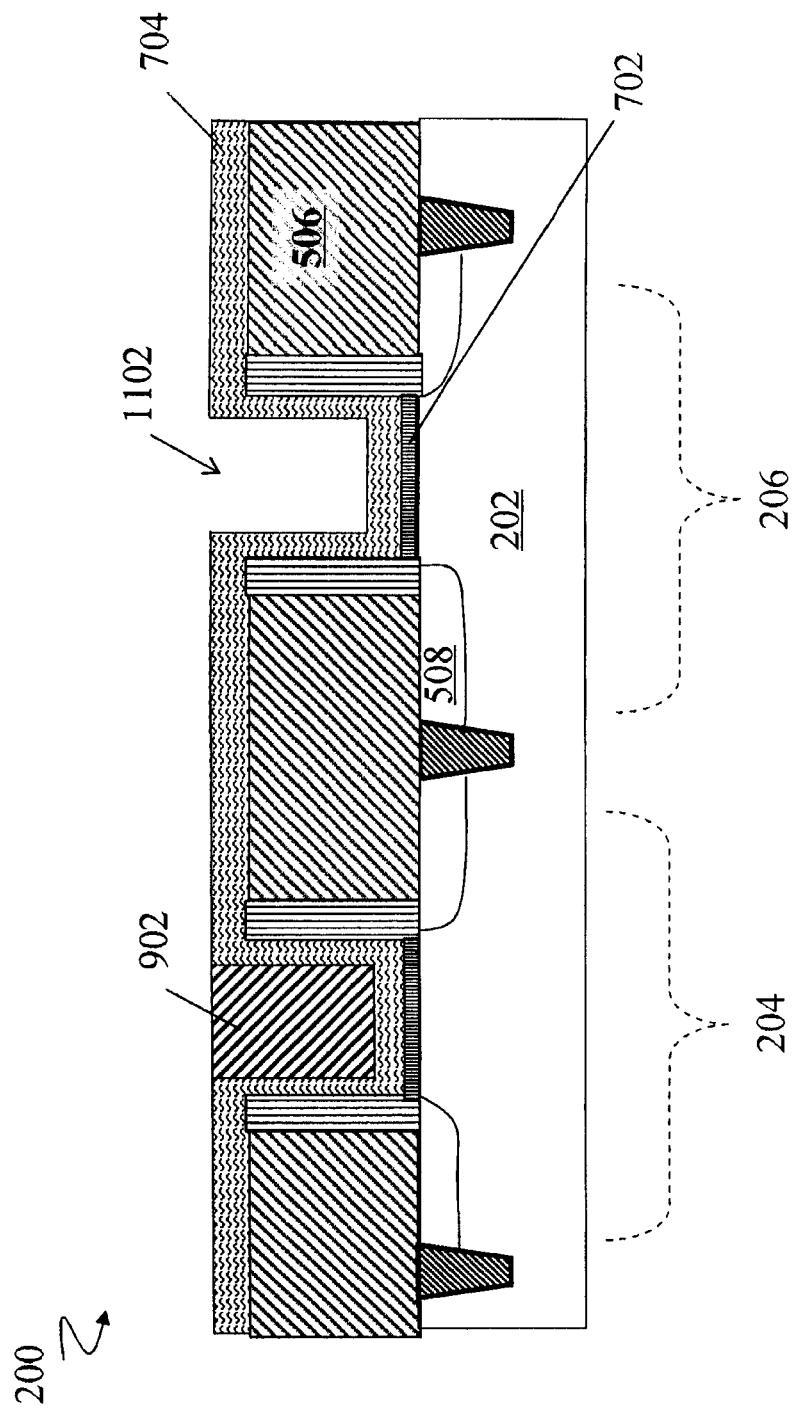

Referring to the example of FIG. 11, the device 200 is illustrated with the blocking layer 902 removed from the second region 206 of the substrate 202, leaving an opening 1102.

Following the removal of the blocking layer 902 from the second region 206, the masking element 1002 (see FIG. 10) is removed from the substrate. The masking element 1002 may be removed by suitable processes such as a photoresist stripping process.

The method 100 then proceeds to block 122 where a first work function layer is formed on the substrate. The first work function layer may include a first type of work function material. In an embodiment, the first type of work function material is a p-type work function metal or p-metal. Exemplary p-type work function metals include TiN, TaN, Ru, Mo, WN, $ZrSi_2$, $MoSi_2$, $TaSi_2$, $NiSi_2$, WN, other suitable p-type work function materials, or combinations thereof. In an alternative embodiment, the first type of work functional metal is an n-type work function metal. Exemplary n-type work function metals include Ti, Ag, Al, TaAl, TaAlC, TiAlN, TaC, TaCN, TaSiN, Mn, Zr, other suitable n-type work function materials, or combinations thereof A work function value is associated with the material composition of the work function layer, and thus, the material of the first work function layer is chosen to tune its work function so that a desired threshold voltage Vt is achieved in the device that is to be formed in the respective region. The first work function layer may be deposited by CVD, PVD, and/or other suitable process.

Figure 12:
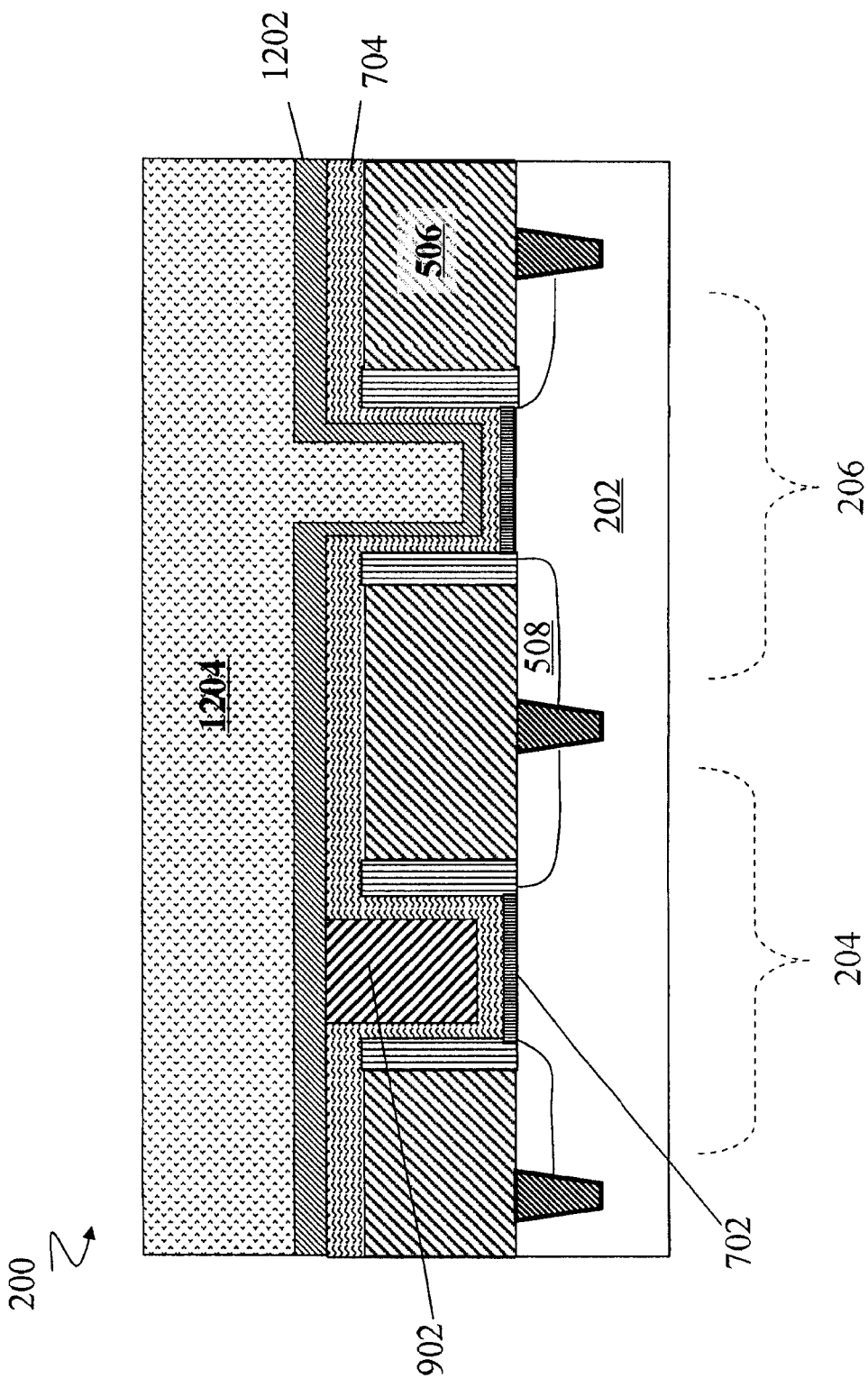
Figure 13:
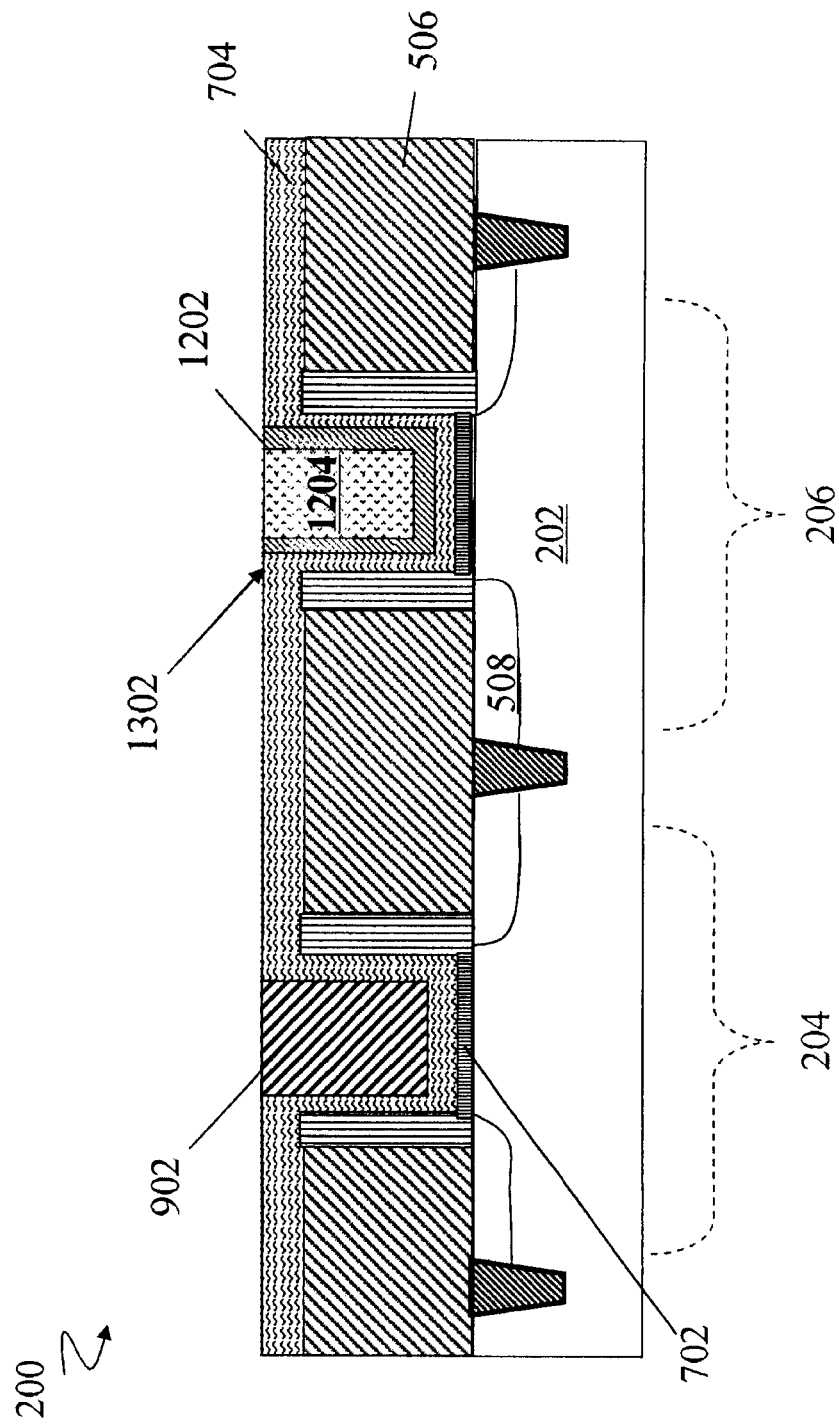

Referring to the example of FIG. 12, a work function layer 1202 is disposed on the substrate 202. In an embodiment, the work function layer 1202 provides a p-type work function. Exemplary compositions for the work function layer 1202 include, but are not limited to, TiN, TaN, $ZrSi_2$, $MoSi_2$, $TaSi_2$, $NiSi_2$, and WN. The work function layer 1202 may be between approximately 10 Angstroms and approximately 100 Angstroms in thickness. The work function layer 1202 may be chosen (e.g., material and/or thickness) such that it provides a suitable work function for a semiconductor device in region 206 of the substrate 202. For example, in an embodiment, the work function layer 1202 is chosen such that a suitable work function is provided for a PMOSFET semiconductor device. It is noted that while the work function layer 1202 is formed in the opening 1102, within which a metal gate will be formed, the work function layer 1202 is not formed in the gate region of the first region 204 of the substrate. The opening left by the removal of the dummy gate structure in the first region 204 remains filled with blocking layer 902.

The method 100 then proceeds to block 124 where a first fill metal is formed on the substrate. The fill metal may include Al, W, or Cu and/or other suitable materials. The fill metal may be formed by CVD, PVD, plating, and/or other suitable processes. The fill metal may be deposited over the work function layer, described above with reference to block 122, and thereby filling in the remaining portion of the opening or trench formed by the removal of the dummy gate electrode in the second region of the substrate. Referring to the example of FIG. 12, a fill metal 1204 is formed on the substrate 202. The fill metal 1204 fills the remainder of the opening 1102, described above with reference to FIG. 11.

The method 100 then proceeds to block 126 where the substrate is planarized. The planarization may remove the fill metal and/or first work function layer from overlying a dielectric (e.g., ILD layer) interposing the gate structures of the device. Referring to the example of FIG. 13, the device 200 has been planarized removing the work function layer 1202 and the fill metal 1204 from the surface of the ILD layer 506. Thus, a gate structure 1302 is provided in the second region 206 of the substrate 202. The gate structure 1302 includes the interfacial layer 702, the gate dielectric layer 704, the first work function layer 1202 and the fill layer 1204. The gate structure 1302 may be associated with a PMOSFET device.

The method 100 then proceeds to block 128 where the blocking layer is removed from the first region of the semiconductor substrate. The blocking layer (or hard mask material) may be removed by suitable methods. These methods include $NH_4OH$ and dilute-HF (DHF) solutions, solvents, phosphoric acid, and dry etch. In an embodiment, the blocking layer includes polysilicon and/or amorphous silicon and is removed by $NH_4OH$ and/or DHF solutions. In another embodiment, the blocking layer includes $SiO_2$ or SOG and is removed by DHF. In yet another embodiment, the blocking layer includes SOG and is removed by a suitable solvent. In still another embodiment, the blocking layer includes $Si_3N_4$ and is removed by phosphoric acid.

Figure 14:
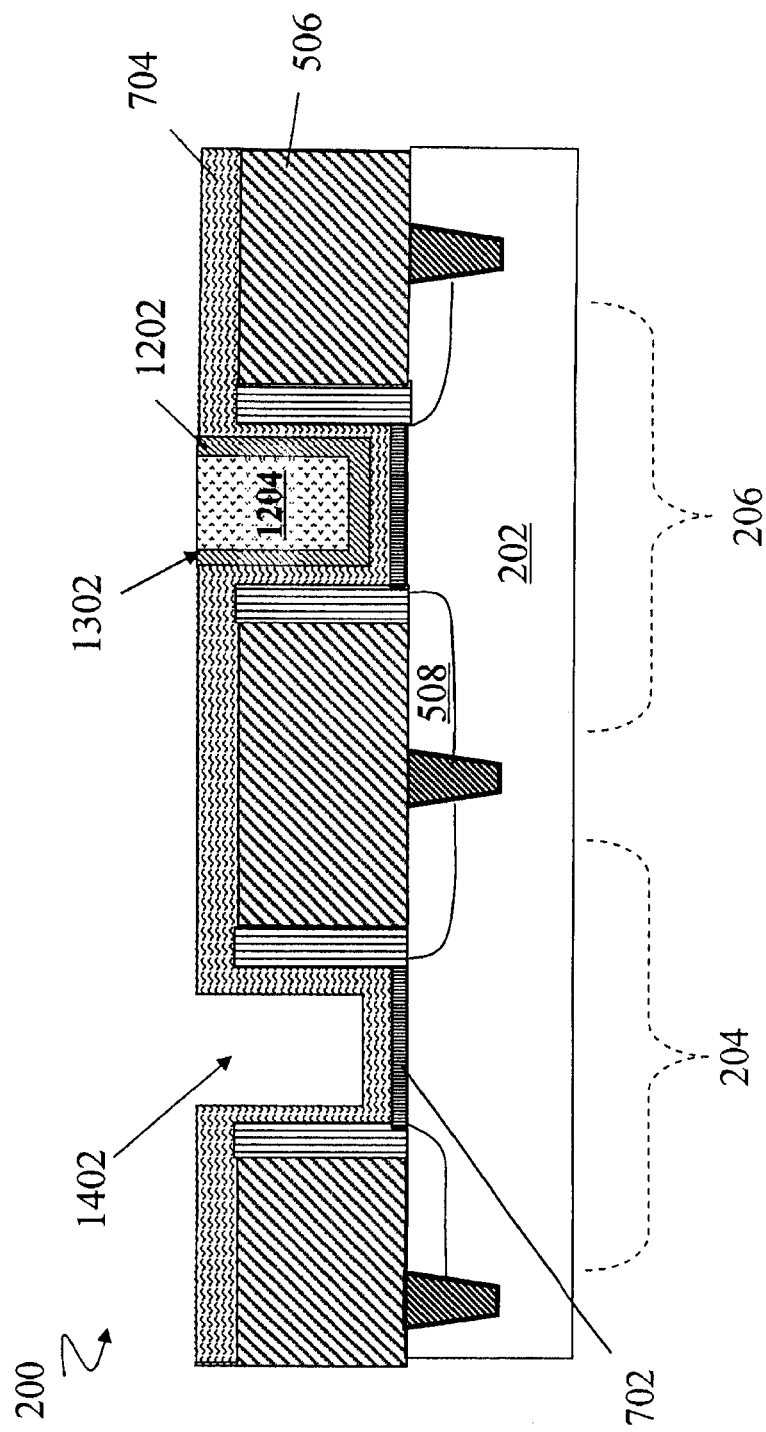

Referring to the example of FIG. 14, the device 200 is illustrated with the blocking layer 902 removed from the first region 204 of the substrate 202, leaving an opening 1402.

The method 100 then proceeds to block 130 where a second work function layer is formed on the substrate. The second work function layer may be of a different type than the first work function layer (e.g., n-type or p-type). For example, the second work function layer may include a second type of work function material. In an embodiment, the second type of work functional metal is an n-type work function metal. Exemplary n-type work function metals include Ti, Ag, Al, TaAl, TaAlC, TiAlN, TaC, TaCN, TaSiN, Mn, Zr, other suitable n-type work function materials, or combinations thereof. In an embodiment, the second type of work function material is a p-type work function metal or p-metal. Exemplary p-type work function metals include TiN, TaN, Ru, Mo, WN, $ZrSi_2$, $MoSi_2$, $TaSi_2$, $NiSi_2$, WN, other suitable p-type work function materials, or combinations thereof. As described above with reference to block 122, the material of the second work function layer is chosen to tune its work function so that a desired threshold voltage Vt is achieved in the device that is to be formed in the respective region. The second work function layer may be deposited by CVD, PVD, and/or other suitable process.

Figure 15:
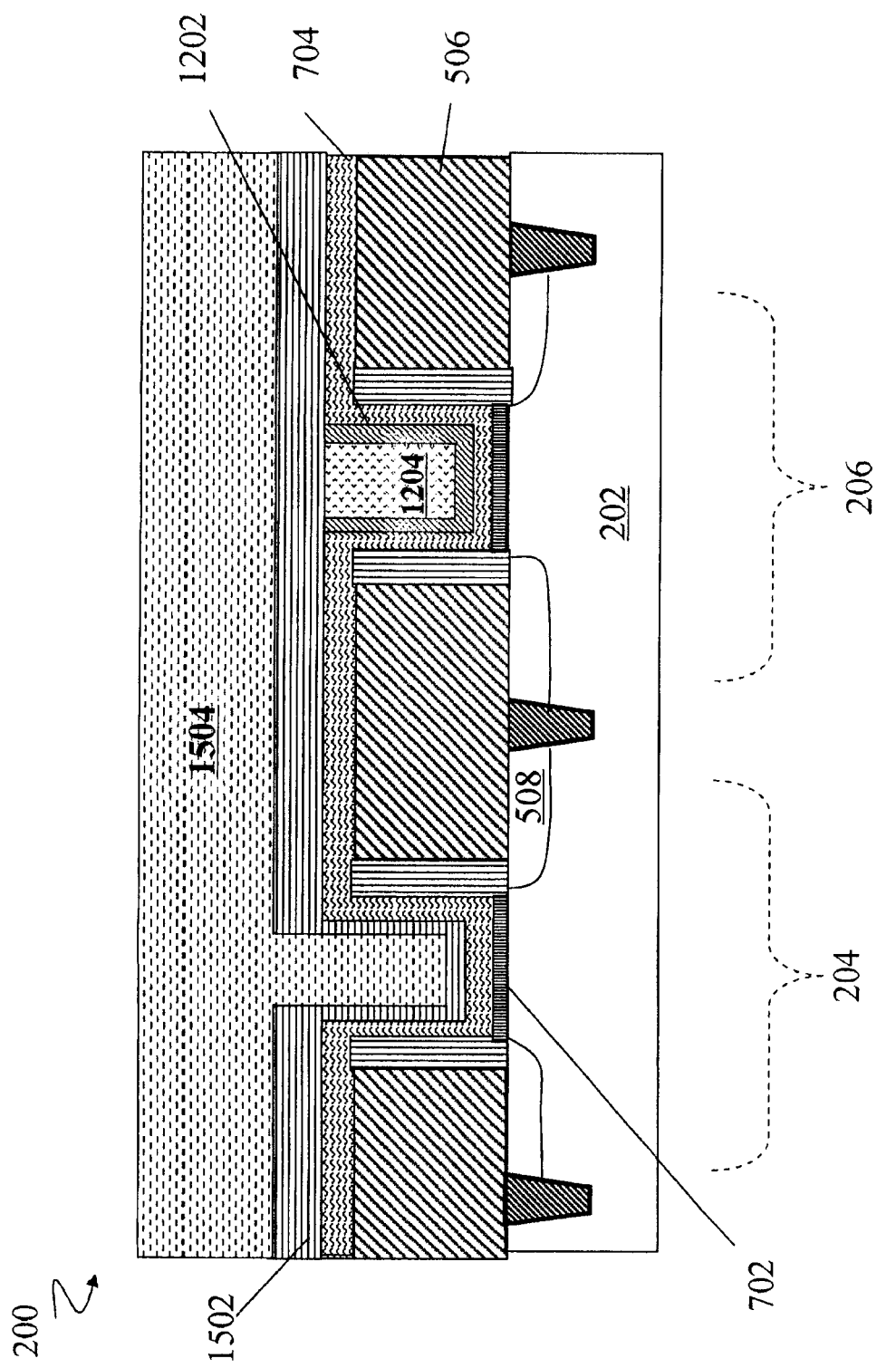

Referring to the example of FIG. 15, a work function layer 1502 is disposed on the substrate 202. The work function layer 1502 may include a different composition than the work function layer 1202. In an embodiment, the work function layer 1502 and the work function layer 1202 are of opposite types (e.g., one is of n-type and one is of p-type). In an embodiment, the work function layer 1502 provides an n-type work function. Exemplary compositions for the work function layer 1502 include, but are not limited to, TiAl, TaC, TaAlC, and/or combinations thereof. The work function layer 1502 may be between approximately 10 Angstroms and approximately 100 Angstroms in thickness. The work function layer 1502 may be chosen (e.g., material and/or thickness) such that it provides a suitable work function for a semiconductor device in region 204 of the substrate 202. For example, in an embodiment, the work function layer 1502 is chosen such that a suitable work function is provided for a NMOSFET semiconductor device of the region 204.

The method 100 then proceeds to block 132 where a second fill metal is formed on the substrate. The fill metal may include Al, W, or Cu and/or other suitable materials. The fill metal may be formed by CVD, PVD, plating, and/or other suitable processes. The fill metal may be deposited over the work function layer, described above with reference to block 130, and thereby filling in the remaining portion of the opening or trench formed by the removal of the dummy gate electrode in the first region of the substrate. The fill metal of block 132 may be the same as, or different than, the fill metal described above with reference to block 124 of the method 100. Referring to the example of FIG. 15, a fill metal 1504 is formed on the substrate 202. The fill metal 1504 fills the remainder of the opening 1402, described above with reference to FIG. 14.

The method 100 then proceeds to block 134 where the substrate is planarized. The planarization may remove excess of the second work function layer and/or second fill layer, for example, the material overlying a dielectric (e.g., ILD) layer interposing gate structures of the device. The planarization may be performed using a suitable CMP process. Referring to the example of FIG. 16, the second work function layer 1502 and second fill layer 1504 are removed from the regions overlying the ILD layer 506. Thus, a gate structure 1602 is formed in the first region 204 of the substrate 202. The gate structure 1602 includes the interfacial layer 702, the gate dielectric layer 704, the second work function layer 1502 and the second fill layer 1504. In an embodiment, the gate structure 1502 may be associated with a NMOSFET device. In a further embodiment, the gate structure 1502 may be associated with a NMOSFET device and the gate structure 1302 is associated with a PMOSFET device. Though FIG. 16 illustrates the gate dielectric layer 704 disposed on the ILD 506 surface, other embodiments are possible including those where the gate dielectric layer 704 is removed from the surface of the ILD 506 during the planarization process of block 134 and/or block 126.

Figure 16:
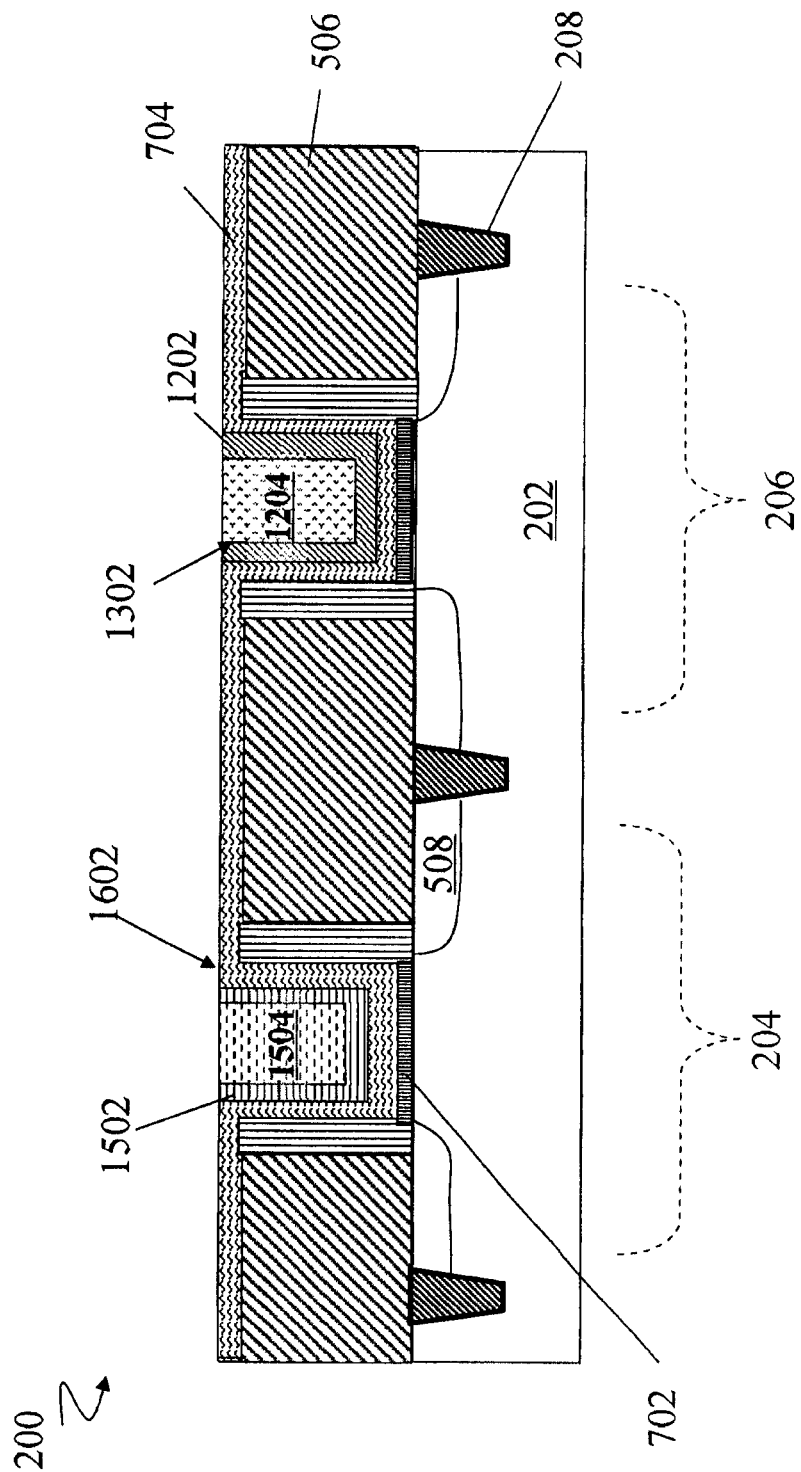

Thus, FIG. 16 illustrates the device 200 having two gate structures—gate structure 1302 and gate structure 1602, with different work function material layers. The work function layer 1502 is exclusive to the first region. The work function layer 1202 is exclusive to the second region. Thus, embodiments of the method 100 and the resultant device provide for improved threshold voltage control as the work function materials are capable of being separately selected for the first and second regions of a substrate. Embodiments of the method also allow for a single work function material to be used for each gate structure of a transistor.

The method 100 may then proceed to block 136 where formation of other features of the device not discussed in detail herein, such as, for example, back-end-of-the-line (BEOL) processing and features (multi-layer interconnects), contacts, and/or other suitable features as known in the art is performed.

Thus, provided in one of the broader embodiments of the present disclosure is a method for fabricating a semiconductor device providing a substrate having a first region and a second region. A first gate electrode is formed in the first region, and a second gate electrode is formed in the second region. The second gate electrode includes a second work function layer and not a first work function layer. The first gate electrode includes the first work function layer and not the second work function layer.

In another embodiment described, a method of fabricating a semiconductor device is provided. The method includes providing a substrate and forming a first opening and a second opening on the substrate. A blocking layer is formed in the first opening. A second metal gate electrode is formed in the second opening while the blocking layer is in the first opening. Thereafter, the blocking layer is removed from the first opening. A first metal gate electrode is then formed in the first opening after removing the blocking layer.

Further, in an embodiment, a semiconductor device is provided. The device includes a first gate structure including a first gate electrode and a second gate structure including a second gate electrode. The second gate electrode includes a second work function layer and not a first work function layer. The first gate electrode includes the first work function layer and not the second work function layer. In embodiments, the first work function layer is formed directly on a gate dielectric and a fill layer may be formed directly on the first work function layer, providing a gate structure including the first gate electrode. Similarly, in embodiments, the second work function layer is formed directly on a gate dielectric and a fill layer may be formed directly on the second work function layer, providing a gate structure including the second gate electrode.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A method of fabricating a semiconductor device, comprising:
   providing a substrate having a first region and a second region, wherein the first region includes a first opening and the second region includes a second opening;
   filling the second opening with a blocking material, wherein the blocking material comprises at least one of amorphous silicon, spin on glass, silicon dioxide, and silicon nitride ($Si_3N_4$);
   forming a first gate electrode in the first opening while the blocking material fills the second opening, wherein the forming the first gate electrode in the first opening, includes:
      forming a first work function layer directly on a gate dielectric layer;
      forming a first fill metal layer directly on the first work function layer; and
      planarizing the first fill metal layer such that its top surface is coplanar with a top surface of the blocking material in the second opening;
   removing the blocking material after forming the first gate electrode; and
   forming a second gate electrode in the second opening, wherein the second gate electrode includes a second work function layer and not the first work function layer, and the first gate electrode includes the first work function layer and not the second work function layer, and wherein the forming the second gate electrode in the second opening, includes:
   forming the second work function layer directly on the gate dielectric layer; and
   forming a second fill metal layer directly on the second work function layer.

2. The method of claim 1, further comprising:
   forming a first dummy gate structure in the first region and a second dummy gate structure in the second region of the substrate; and
   removing the first and second dummy gate structures to form the first opening and the second opening, wherein the first and second openings are formed in a layer disposed on the substrate.

3. The method of claim 1, wherein the first work function layer is an n-type work function layer and the second work function layer is a p-type work function layer.

4. The method of claim 1, wherein the forming the first gate electrode includes forming the first work function layer having a material selected from the group consisting of Ti, Ag, Al, TaAl, TaAlC, TiAlN, TaC, TaCN, TaSiN, Mn, and Zr.

5. The method of claim 4, wherein the forming the second gate electrode includes forming the second work function layer having a material selected from the group consisting of: TiN, TaN, Ru, Mo, WN, $ZrSi_2$, $MoSi_2$, $TaSi_2$, $NiSi_2$, and WN.

6. The method of claim 1, wherein the first and second fill metal layers have the same composition.

7. A method comprising:
   forming a first opening and a second opening on a substrate;
   depositing a blocking layer in the first opening, wherein the blocking material is selected from the group consisting of spin on glass, silicon dioxide, and silicon nitride ($Si_3N_4$);

planarizing the blocking layer such that its top surface of the selected one of spin on glass, silicon dioxide, and silicon nitride ($Si_3N_4$) is coplanar with a top of the first opening;

after planarization, forming a second metal gate electrode in the second opening while the blocking layer is in the first opening;

removing the blocking layer from the first opening after forming the second metal gate electrode; and forming a first metal gate electrode in the first opening after removing the blocking layer.

8. The method of claim 7, wherein the forming the first opening and the second opening includes:

forming a first dummy gate structure and a second dummy gate structure;

forming a dielectric layer interposing the first and second dummy gate structures;

removing the first dummy gate structure to form the first opening; and removing the second dummy gate structure to form the second opening.

9. The method of claim 7, wherein the forming the blocking layer in the first opening includes depositing silicon nitride ($Si_3N_4$).

10. The method of claim 7, further comprising:

forming the blocking layer in the second opening concurrently with forming the blocking layer in the first opening;

forming a masking element on the blocking layer in the first opening; and removing the blocking layer in the second opening while the masking element is disposed on the blocking layer in the first opening.

11. The method of claim 7, wherein the forming the second metal gate electrode includes forming an n-type work function layer and a fill layer.

12. The method of claim 11, wherein the forming the first metal gate electrode includes forming a p-type work function layer.

13. The method of claim 7, wherein the forming the second metal gate electrode includes forming an n-type work function layer and not a p-type work function layer, and forming a fill layer overlying the n-type work function layer.

14. The method of claim 13, wherein the forming the first metal gate electrode includes forming a p-type work function layer and not an n-type work function layer.

15. The method of claim 1, wherein the blocking layer includes silicon oxide in the first opening.

16. The method of claim 1, wherein the blocking layer includes spin on glass (SOG) layer in the first opening.

17. The method of claim 1, wherein the removing the blocking material includes applying a solution including at least one of $NH_4OH$, dilute-HF (DHF), a solvent, or phosphoric acid.

* * * * *